(12) United States Patent
Liu

(10) Patent No.: US 7,091,052 B2
(45) Date of Patent: Aug. 15, 2006

(54) METHOD OF FORMING FERROELECTRIC MEMORY CELL

(75) Inventor: Haochieh Liu, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/946,289

(22) Filed: Sep. 22, 2004

(65) Prior Publication Data

US 2005/0090023 A1 Apr. 28, 2005

Related U.S. Application Data

(63) Continuation of application No. 10/165,961, filed on Jun. 11, 2002, now Pat. No. 6,828,160.

(51) Int. Cl.
*H01L 21/00* (2006.01)

(52) U.S. Cl. .......................................... 438/3; 438/240

(58) Field of Classification Search ............. 438/3, 438/240, 593
See application file for complete search history.

(56) References Cited

U.S. PATENT DOCUMENTS

| | | | |
|---|---|---|---|
| 5,439,839 A | 8/1995 | Jang | |
| 5,668,065 A | 9/1997 | Lin | |
| 5,731,608 A | 3/1998 | Hsu et al. | |
| 5,976,949 A | 11/1999 | Chen | |
| 6,048,738 A | 4/2000 | Hsu et al. | |
| 6,514,842 B1 * | 2/2003 | Prall et al. | 438/593 |
| 6,587,365 B1 * | 7/2003 | Salling | 365/145 |

OTHER PUBLICATIONS

J. F. Scott, et al., *Ferroelectric Memory Applications*, Ultrasonics Symposium, pp. 299-308 (1989).
T. Nakamura, et al., *A single-transistor ferroelectric memory cell*, ISSCC95, pp. 68-69 and 340 (1995).
K.H. Kim, *Metal-ferroelectric-semiconductor (MFS) FET's using LiNbO$_3$/Si (100) structures for nonvolatile memory application*, Electronic Device Letters, vol. 19, No. 6, pp. 204-206 (Jun. 1998).
E. Tokumitsu, et al., *Nonvolatile memory operations of metal-ferroelectric-insulator-semiconductor (MFIS) FET's using PLZT/STO/Si (100) structures*, Electronic Device Letters, vol. 18, No. 4, pp. 160-162 (Apr. 1997).
Y. Fujimori et al., *Properties of Sr$_2$Nb$_2$O$_7$ family ferroelectric thin films*, International Sumposium on Applications of Ferroelectrics, pp. 55-58 (1998).
H. Ishiwara, *Current status and prospects of FET-type ferroelectric memories*, Device Research Conference Digest, pp. 6-9 (1999).

* cited by examiner

*Primary Examiner*—Phuc T. Dang
(74) *Attorney, Agent, or Firm*—Finnegan, Henderson, Farabow, Garrett & Dunner, L.L.P.

(57) ABSTRACT

A MFMIS memory device is provided with an inverted T-shaped gate stack, which is formed using only one word line mask. The MFMIS memory device is formed using one word line mask, which forms the word line, and using spacers to form an inverted T-shaped gate stack, which is compatible with self-aligned etch processes.

26 Claims, 16 Drawing Sheets

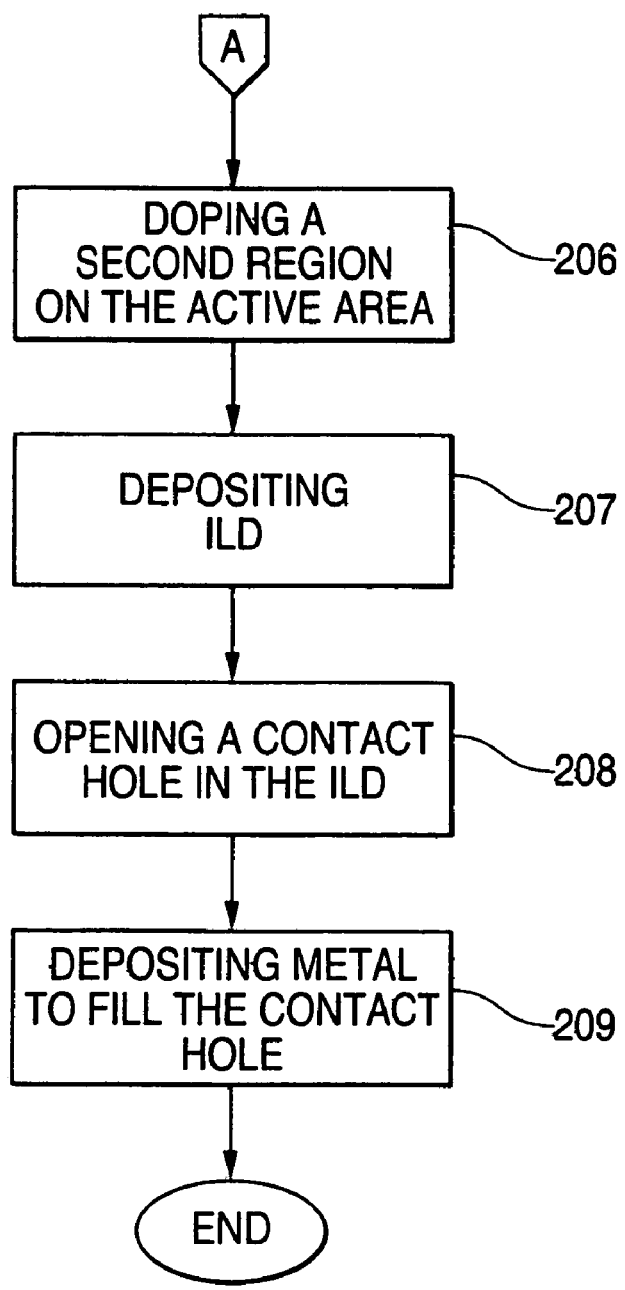

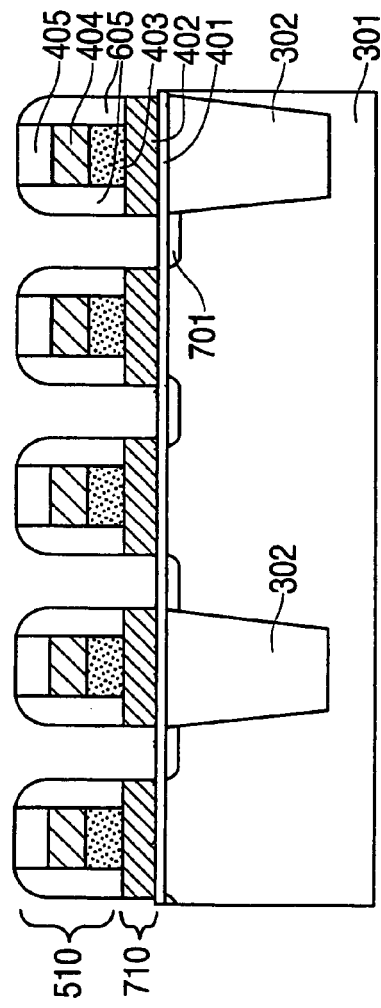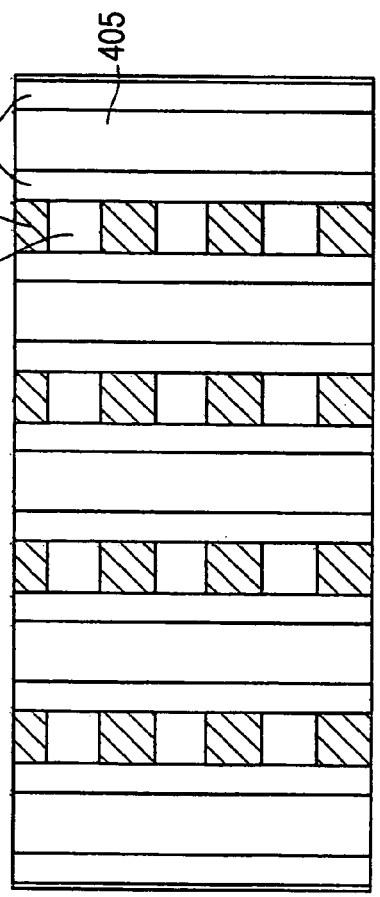
FIG. 7(a)
FIG. 7(b)

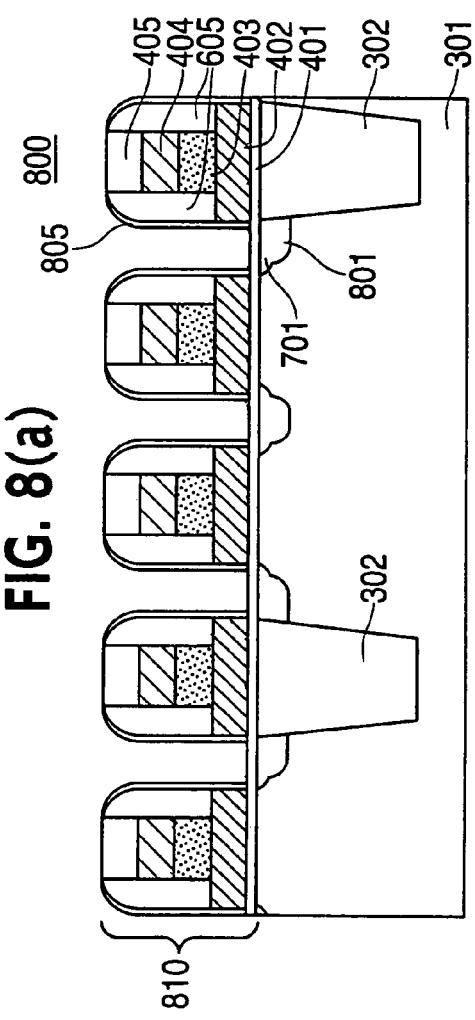
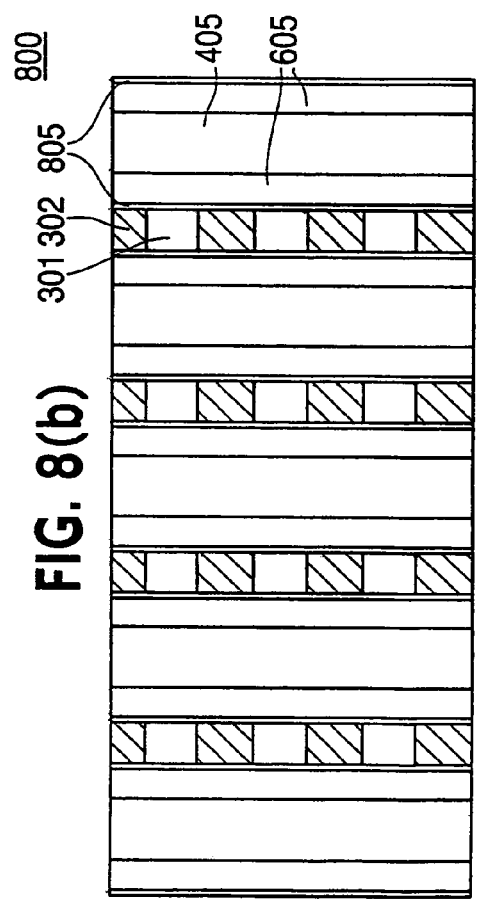

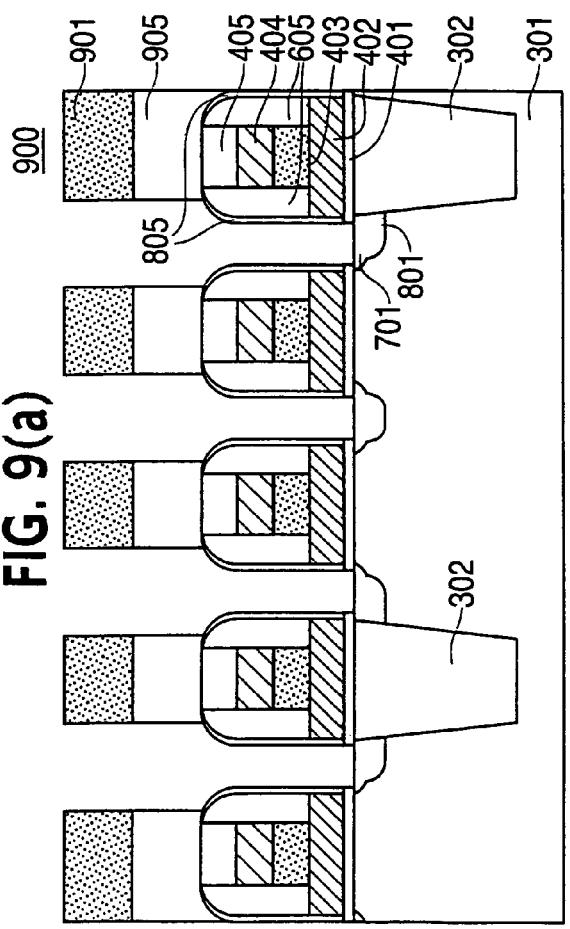
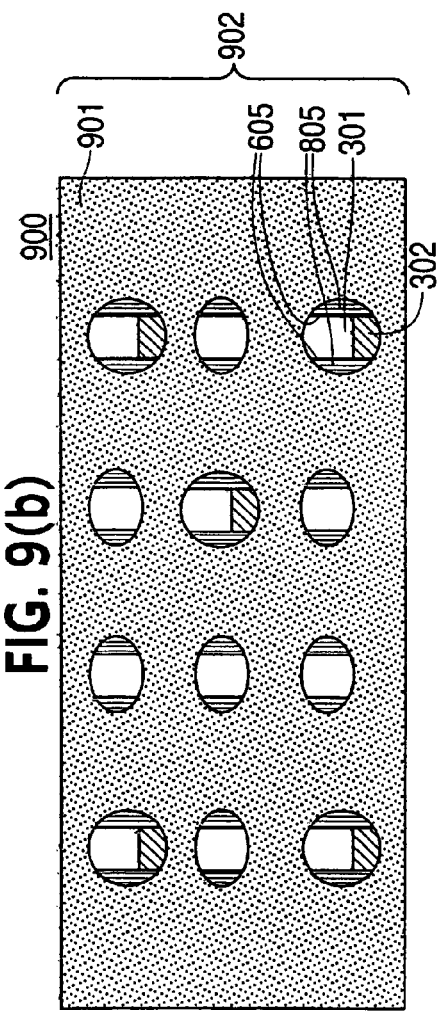
FIG. 9(a)
FIG. 9(b)

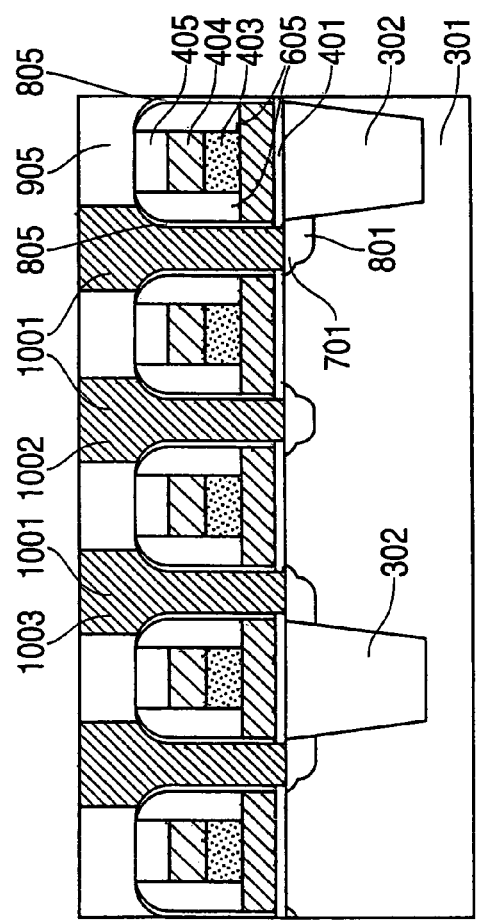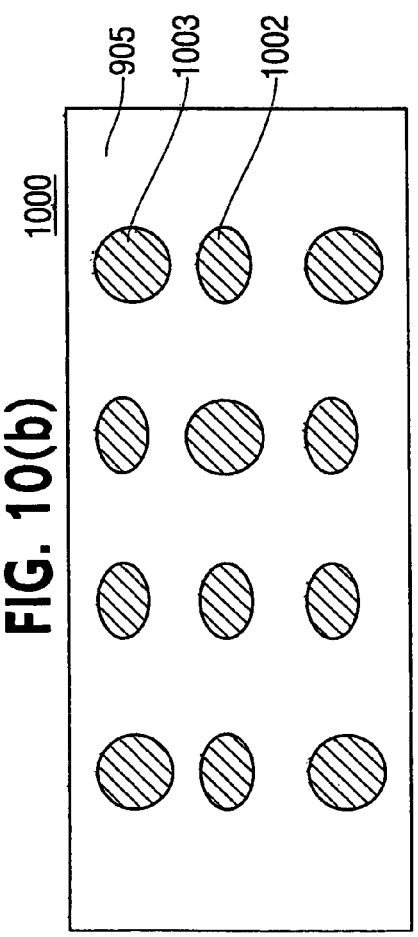

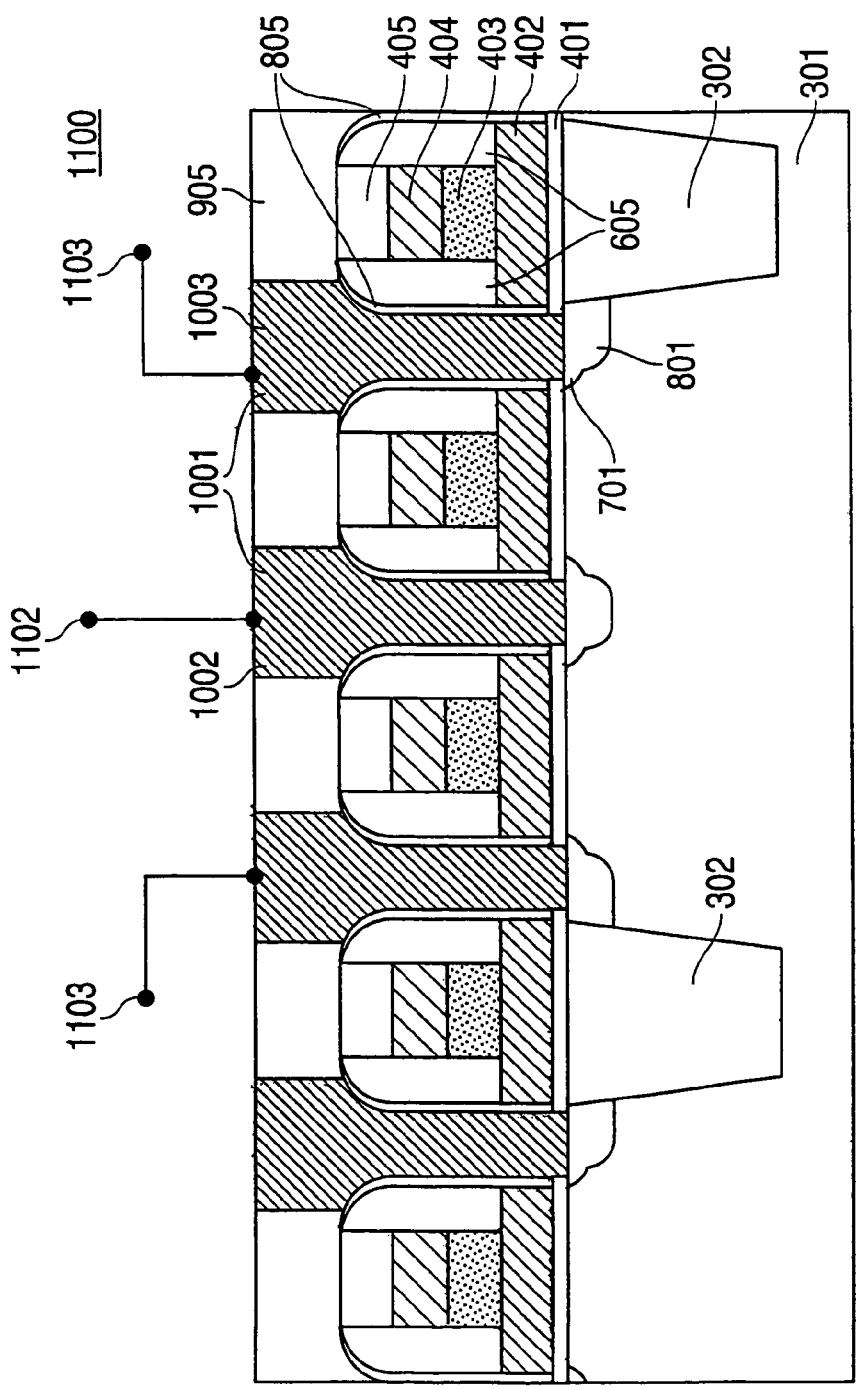

METHOD OF FORMING FERROELECTRIC MEMORY CELL

This is a continuation of application Ser. No. 10/165,961, filed Jun. 11, 2002, now U.S. Pat. No. 6,828,160 the entire contents of which are incorporated herein by reference.

FIELD OF THE INVENTION

This invention relates generally to ferroelectric memory devices, and more particularly to ferroelectric random access memory devices formed with an inverted T-shaped gate stack and methods for making the same.

BACKGROUND OF THE INVENTION

Memory devices including ferroelectric films have attracted attention for their nonvolatile characteristics. Such memory devices are also desirable for high speed reading and writing capabilities that result from their non-destructive read out memory characteristics, which results from storing information as a polarization direction rather than as a charge on a capacitor.

Ferroelectric memory devices may comprise various components. One type of a ferroelectric random access memory ("FeRAM") has a two transistor, two capacitor configuration similar to a DRAM. Such a device is discussed in greater detail in "Ferroelectric Memory Applications," J. F. Scott, et al., ULTRASONIC SYMPOSIUM, 299 (1989). Another type of FeRAM is a transistor-cell type—ferroelectric field effect transistor ("FeFET")—which stores data in ferroelectric gate transistors, and which requires no capacitor structure similar to a DRAM. The latter type of FeRAM provides the advantages over the first type of occupying less surface area and providing non-destructive readout.

Various types of FeFETs may be constructed, each having its own advantages and drawbacks. The various types may include an MFS FET, which comprises a metal layer, a ferroelectric layer, and a semiconductor layer; an MFIS FET, which comprises a metal layer, a ferroelectric layer, an insulator layer, and a semiconductor layer; an MFMS FET, which comprises a metal layer, a ferroelectric layer, a metal layer, and a semiconductor layer; and an MFMIS FET, which comprises a metal layer, a ferroelectric layer, a metal layer, an insulator layer, and a semiconductor layer.

Although FeFET devices possess many desirable characteristics, many problems have been encountered in attempts to fabricate certain types of efficient FeFET devices. For example, it is difficult to form an acceptable crystalline ferroelectric film directly on semiconductor material. Additionally, because of a chemical reaction between ferroelectric and semiconductor materials, it is difficult to have a clean interface between the ferroelectric material and the semiconductor material as ferroelectric material may diffuse into a silicon substrate. Further, there may be a problem retaining an adequate electric charge in the ferroelectric material.

In the past, these problems have been addressed with the MFMIS FET. The MFMIS FET provides a metal layer between the ferroelectric layer and semiconductor layer, thus providing a buffer layer. The composition and past methods of fabricating an MFMIS FET circuit presents problems of their own. An MFMIS FET includes an MIS capacitor in series with an MFM capacitor. For efficient low voltage operation of the MFMIS FET, the capacitance ratio between the MFM capacitor and the MIS capacitor cannot be too large. However, because the dielectric constant of ferroelectric materials is higher than that of an insulator, the MFM capacitor may have a higher capacitance than the MIS capacitor. Consequently, the MIS capacitance should be increased for efficient operation.

Possible ways to increase the MIS capacitance include the following approaches. First, the gate dielectric layer of the MIS capacitor, i.e., the insulator layer, may be thinned-down. Second, the gate dielectric of the MIS capacitor may be replaced with another material having high dielectric properties. And third, the physical area of the MIS capacitor may be made larger than that of the MFM capacitor.

In the past, the approach of increasing the physical area of the MIS capacitor led to the formation of an MFMIS FET device in the shape of an inverted-T (herein after referred to as "inverted T-shaped gate stack"), which required two photoresist masks in forming the word line. As shown in FIG. 1, an MFMIS FET device 100 in the prior art comprises a substrate 101, a doped region 102, a contact plug 103, an isolation region 104, and an inverted T-shaped gate stack 105, including a first electrode layer 106, a ferroelectric layer 107, a second electrode layer 108, an insulator layer 109, and substrate 101. MFMIS FeFET device 100 is formed using more than one word line mask—a first word line mask is used to etch second electrode layer 108 and insulator layer 109, and a second word line mask is used to etch first electrode layer 106 and ferroelectric layer 107, thus forming an MIS capacitor physically larger than an MFM capacitor. Increasing the number of word line masks increases the risk of leakage and short circuits as a result of misalignment and is incompatible with self-aligned contact etch processes commonly used for cell area reduction. To prevent leakage or a short circuit, isolation region 104 requires extra spacing between a contact plug 103 and an inverted T-shaped gate stack 105 to prevent, for example, shorts. Isolation region 104 may comprise, for example, a dielectric material.

To overcome the problems of the prior art, a MFMIS device with an inverted T-shaped gate stack formed using one word line mask and compatible with self-aligned contact processes is desired.

SUMMARY

In one embodiment of the invention, a method of forming a ferroelectric device comprises forming at least one active area on a silicon substrate by shallow trench isolation, depositing a plurality of layers on the at least one active area and a shallow trench isolation area, wherein the plurality of layers includes an insulator layer, a first electrode layer, a ferroelectric layer, a second electrode layer, and a first dielectric layer, etching at least one of the plurality of layers based on a word line mask to form a first etched layer and an unetched layer, forming a first spacer to define the first etched layer, etching at least a portion of the unetched layer based on the first spacer to form a second etched layer, forming a second spacer to define the second etched layer, forming an interlayer dielectric, opening a contact hole in the interlayer dielectric, and forming metal to fill the contact hole.

In another embodiment of the invention, a method of forming a ferroelectric device comprises forming at least one active area in a silicon substrate by shallow trench isolation, depositing a plurality of layers on the at least one active area and a shallow trench isolation are, wherein the plurality of layers includes an insulator layer, a first electrode layer, a ferroelectric layer, a second electrode layer, and a first dielectric layer, etching the first dielectric layer and second electrode layer based on a word line mask to form a first etched layer and an unetched layer, forming a first spacer to define the first etched layer, etching the ferroelectric layer based on the first spacer to form a second etched layer, forming a second spacer to define the second etched layer, etching at least the first electrode layer based on the second spacer to form a third etched layer, doping a first region of the active area and the shallow trench isolation area, wherein the first region is determined by the second spacer, forming a third spacer to define the third etched layer doping a second region of the active area and the shallow trench isolation area, wherein the second region is determined by the third spacer, depositing an interlayer dielectric, opening a contact hole in the interlayer dielectric, and depositing metal to fill the contact hole.

In yet another embodiment of the invention, a method of forming a ferroelectric device comprises forming at least one active area in a silicon substrate by shallow trench isolation, depositing a plurality of layers on the at least one active area and a shallow trench isolation area, wherein the plurality of layers includes an insulator layer, a first electrode layer, a ferroelectric layer, a second electrode layer, and a first dielectric layer, etching the first dielectric layer based on a word line mask to form a first etched layer and an unetched layer, forming a first spacer to define the first etched layer, etching the second electrode layer based on the first spacer to form a second etched layer, forming a second spacer to define the second etched layer, etching the ferroelectric layer based on the second spacer to form a third etched layer, forming a third spacer to define the third etched layer, etching at least the first electrode layer based on the third spacer to form a fourth etched layer, doping a first region of the active area and the shallow trench isolation area, wherein the first region is determined by the third spacer, forming a fourth spacer to define the fourth etched layer doping a second region of the active area and the shallow trench isolation area, wherein the second region is determined by the fourth spacer, depositing an interlayer dielectric, opening a contact hole in the interlayer dielectric, and depositing metal to fill the contact hole.

BRIEF DESCRIPTION OF THE DRAWINGS

It is to be understood that both the foregoing general description and the following detailed description are exemplary and explanatory only and are not restrictive of the invention, as claimed. The accompanying drawings, which are incorporated in and constitute a part of this specification, illustrate possible embodiments of the invention and together with the description, serve to explain the principles of the invention.

FIGS. 2(a) and 2(b) are a flow-chart demonstrating a method of fabricating a ferroelectric memory device consistent with the present invention;

FIGS. 7(a) and 7(b) are a cross section and top view, respectively, of a second etched layer and a first dopant in a device;

FIGS. 8(a) and 8(b) are a cross section and top view, respectively, of a second spacer defining an inverted T-shaped gate stack and a second dopant in a device;

FIGS. 9(a) and 9(b) are a cross section and top view, respectively, of a device including a photoresist mask used to etch interlayer dielectric deposited between inverted T-shaped gate stacks;

FIGS. 10(a) and 10(b) are a cross section and top view, respectively, of a first possible embodiment of the invention;

FIG. 11 is a cross section of the first embodiment of the invention with possible electric connections;

DETAILED DESCRIPTION

Devices and methods consistent with the present invention provide an MFMIS memory device formed in an inverted T-shaped gate stack using one word line mask and compatible with self-aligned contact processes.

Reference will now be made in detail to embodiments consistent with the invention, examples of which are illustrated in the accompanying drawings. Wherever possible, the same reference numbers will be used throughout the drawings to refer to the same or like parts.

Figure 1:
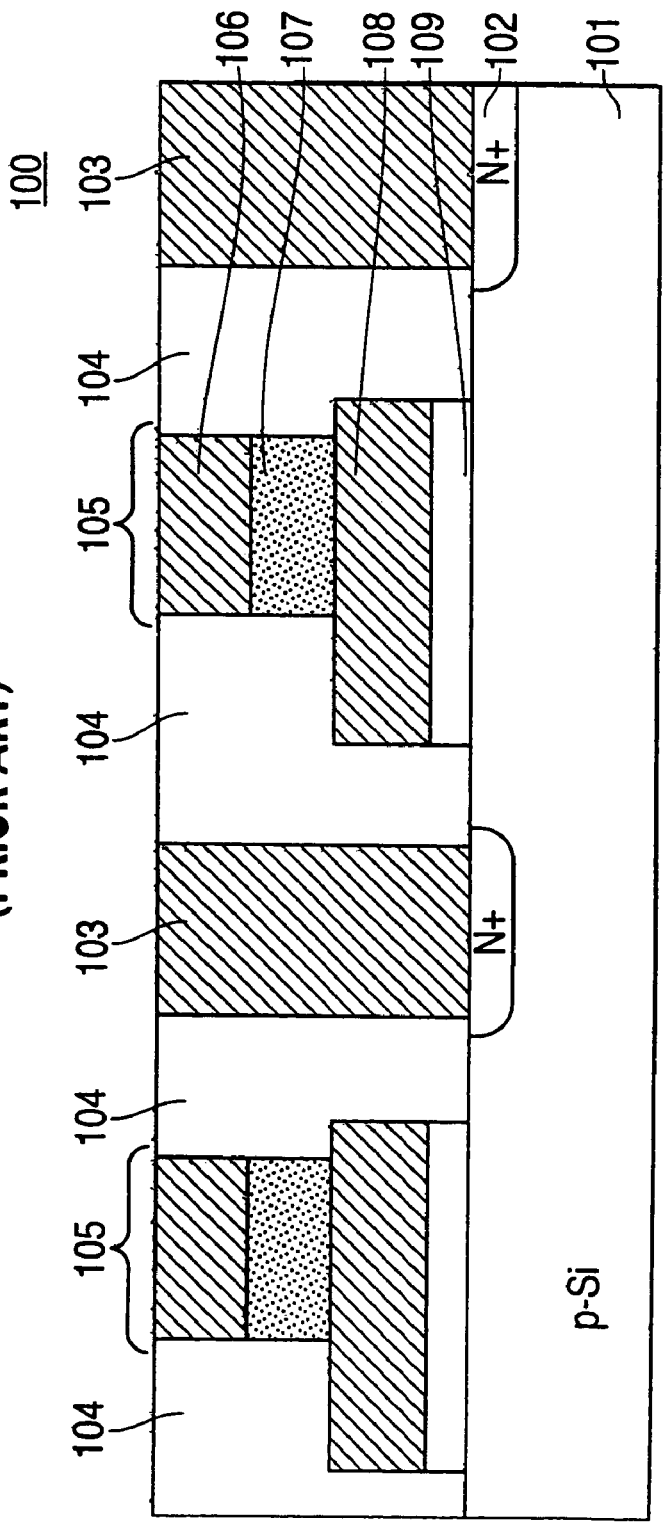
FIG. 1 is a cross section of an MFMIS FET device found in the prior art.
Figure 2A:
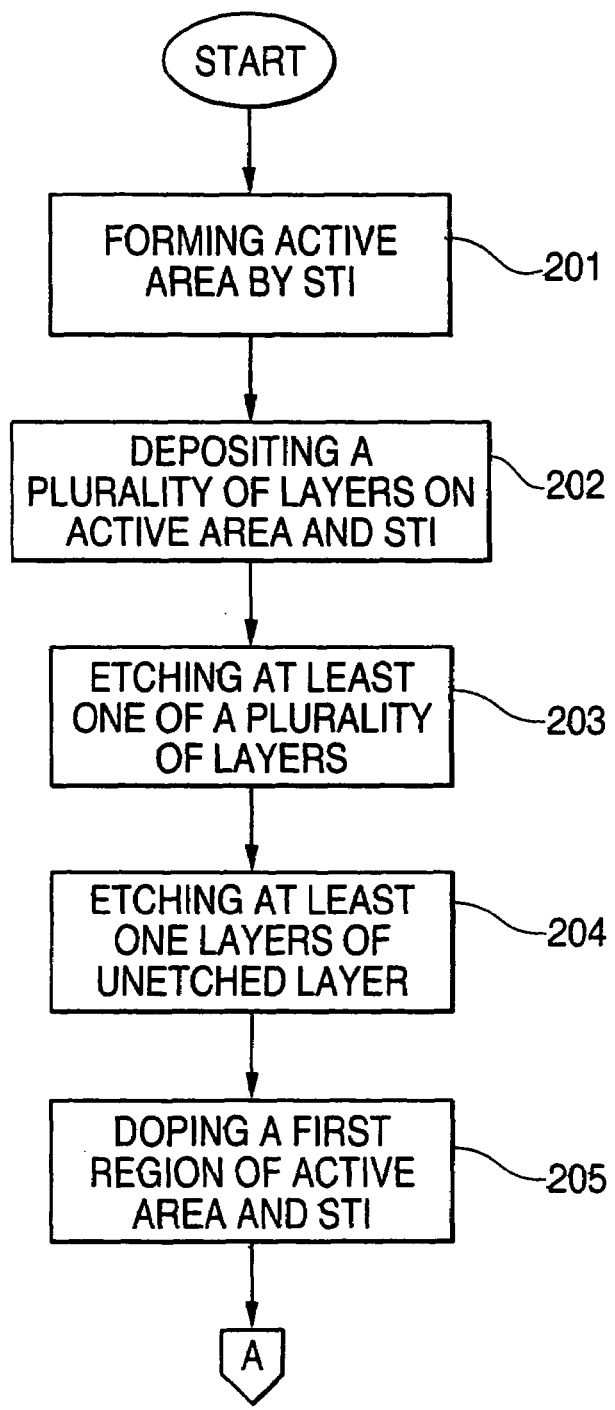

FIGS. 2(a) and 2(b) are a flow-chart demonstrating a method of forming a FeRAM device consistent with the present invention. The method starts with forming at least one active area in a starting substrate separated from at least one other active area by shallow trench isolation, which includes forming shallow trench isolation areas ("STI") (step 201). STI is known to those skilled in the art, as exemplified in U.S. Pat. No. 5,976,949.

Figure 3A:
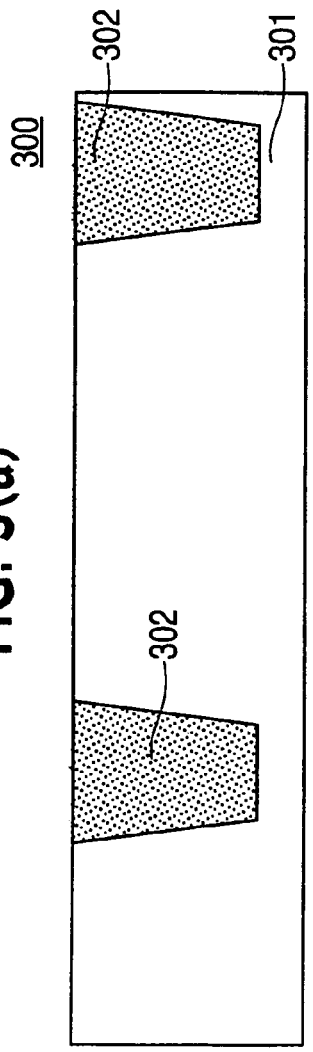
FIGS. 3(a) and 3(b) are a cross section and top view, respectively, of a substrate with active areas separated by shallow trench isolation areas.
Figure 3B:
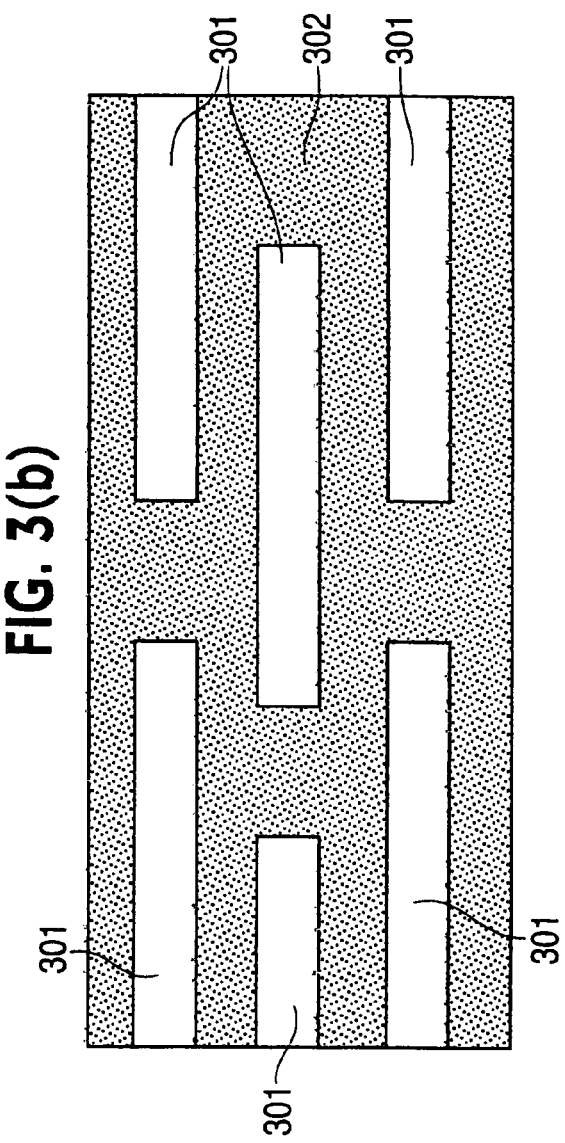

Referring to FIGS. 3(a) and 3(b), there is shown a cross section and top view, respectively, of a substrate 300 with active areas 301 separated by STI 302. Active area 301 is formed, for example, in a starting silicon substrate (not shown) and separated from other active areas (each denoted 301) by STI 302. One skilled in the art will recognize that other starting materials may be used, for example, SOI. Although active area 301 is illustrated as rectangular, one skilled in the art will recognize that any other suitable shape may be used with the present invention. Although reference may be made to a single active area 301, and a single STI 302, it is to be understood that this also refers to a plurality of active areas 301 and STIs 302.

Once active area 301 and STI 302 are formed, processing flows to step 202 where a plurality of layers (including an insulator layer 401, a first electrode layer 402, a ferroelectric layer 403, a second electrode layer 404, and a first dielectric layer 405) are deposited on active area 301 and STI 302.

Figure 4A:
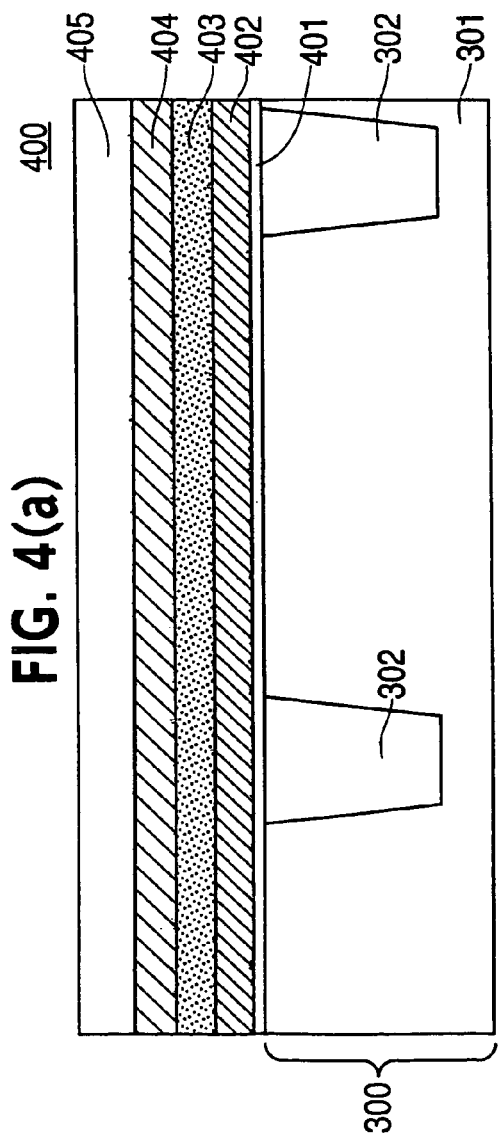
FIGS. 4(a) and 4(b) are a cross section and top view, respectively, of a substrate with a plurality of layers deposited.
Figure 4B:
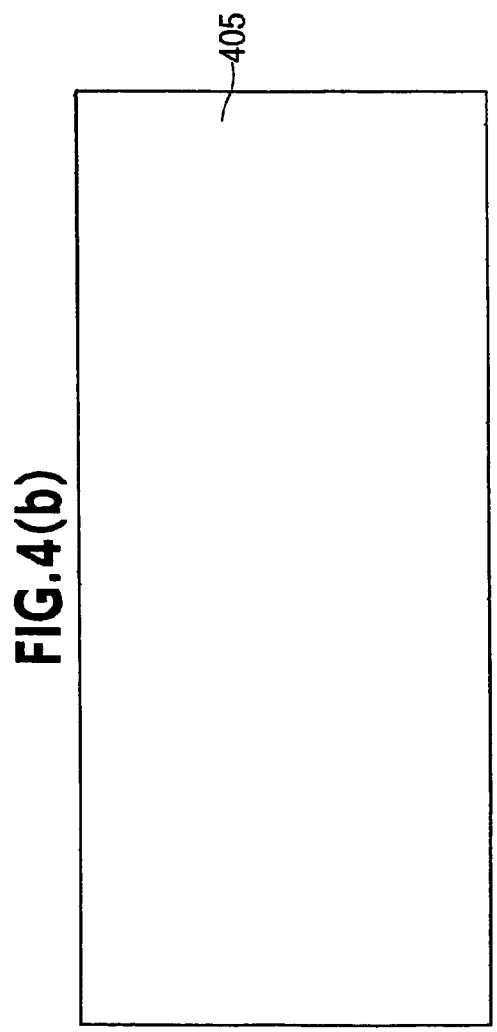

FIGS. 4(a) and 4(b) are a cross section and top view, respectively, of device 400. Referring to FIG. 4(a), it is shown that device 400 comprises a plurality of layers deposited on substrate 300.

As shown, insulator layer 401 is first deposited on substrate 300, in a thickness range, for example, of 20–400 Å.

Insulator layer 401 may comprise, for example, SiO$_2$, SiN, SiON, Al$_2$O$_3$, Ta$_2$O$_5$. First electrode layer 402 is next deposited on insulator layer 401. First electrode layer 402 may comprise a conductor such as a metal, including but not limited to Pt, Ir, and Ti or a combination of metal, conducting metal oxide, an oxygen diffusion barrier, and/or a glue layer including but not limited to Pt/TiN/Ti, Pt/TaSin, IrO$_2$/Ir/TaSiN, Pt/IrO$_2$/Ir/TaSiN; a semiconductor, including but not limited to PolySi, W Six, and Co Six; a metal oxide, including but not limited to IrO$_2$, which may have high electrical conductivity of, for example, 100~1000×10$^{-6}$ Ω/cm; or a multi-layer combination of these conductors. Ferroelectric layer 403 (e.g., PZT, BaMgF$_4$, LiNbO$_3$, PLZT, STO, SNO, etc.) is deposited on first electrode layer 402. Ferroelectric layer 403 may comprise, for example, PZT, BaMgF$_4$, LiNbO$_3$, PLZT, STO, SNO, SBT(SrBi$_2$Ta$_2$O$_3$), and BTO(BaTiO$_3$). Second electrode layer 404 is deposited on ferroelectric layer 403. Second electrode layer 404 may, but need not, comprise a conductor of a material similar to that of first electrode layer 402. Dielectric layer 405 (e.g., SiN or SiO$_2$) is then deposited on second electrode layer 404.

A photoresist mask is then used to etch a word line (hereinafter, referred to as "word line mask") through at least dielectric layer 405, second electrode layer 404, ferroelectric layer 403, and at least partially through first electrode layer 402 (step 203). This etching results in a first etched layer and an unetched layer. The first etched layer comprises one or more of the plurality of layers that had a word line etched using the word line mask, and the unetched layer comprises one or more of the plurality of layers that had no word line etched using the word line mask.

Figure 5A:
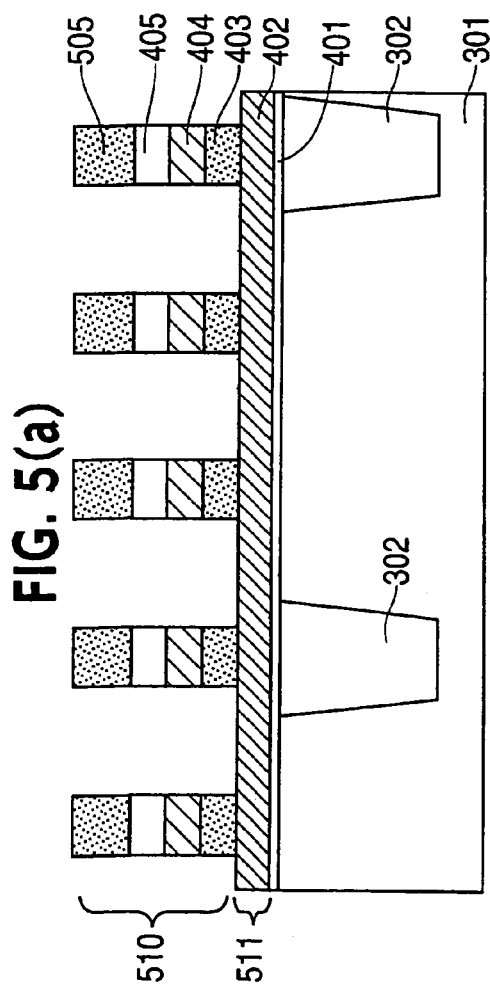
FIG. 5(a) is a cross section of a device with a word line etched in a plurality of layers and FIG. 5(b) is a top view of a word line mask.
Figure 5B:
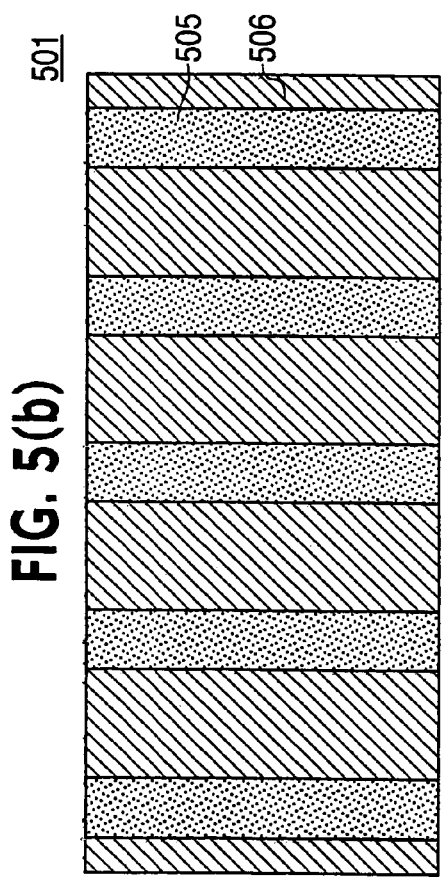

Referring to FIG. 5(a) and FIG. 5(b), there is shown a cross section view of device 500, and a top view of a word line mask 501, respectively. As shown, word line mask 501 comprises photoresist 505 and metal 506, which is used to etch a word line in device 400. Photoresist 505 of word line mask 501 protects regions of the plurality of layers from etching, while metal 506 is used to etch a word line into the unprotected regions of the plurality of layers deposited on substrate 300. Selection of metal 506 and the material for dielectric layer 405, second electrode layer 404, ferroelectric layer 403, first electrode layer 402, and insulator layer 401 determines which layer or layers of the plurality of layers will be etched. Word line mask 501 is used to form a first etched layer 510 and an unetched layer 511.

Metal 506 may be selected such that the etching process stops at first electrode layer 402, thus forming first etched layer 510 comprising first dielectric layer 405, second electrode layer 404, and ferroelectric layer 403, and forming unetched layer 511 comprising second electrode layer 402 and insulator layer 401. After etching metal 506, photoresist 505 may be removed.

In another embodiment, the etching process may stop at ferroelectric layer 403, which may also be partially etched. Thus, first etched layer comprises first dielectric layer 405 and second electrode layer 404, and unetched layer comprises ferroelectric layer 403, second electrode layer 402, and insulator layer 401.

A second dielectric layer is deposited over the unetched layer and the first etched layer, and is etched to form a first spacer. The first spacer acts as a mask protecting regions of the unetched layer along the word line from etching. A portion of the unetched layer is then etched, thus forming a second etched layer (step 204). The second etched layer comprises the portion (i.e., one or more layers comprising the unetched layer) of the unetched layer that was etched according to the first spacer. The first and second etched layers thus form an inverted T-shaped gate stack.

Figure 6A:
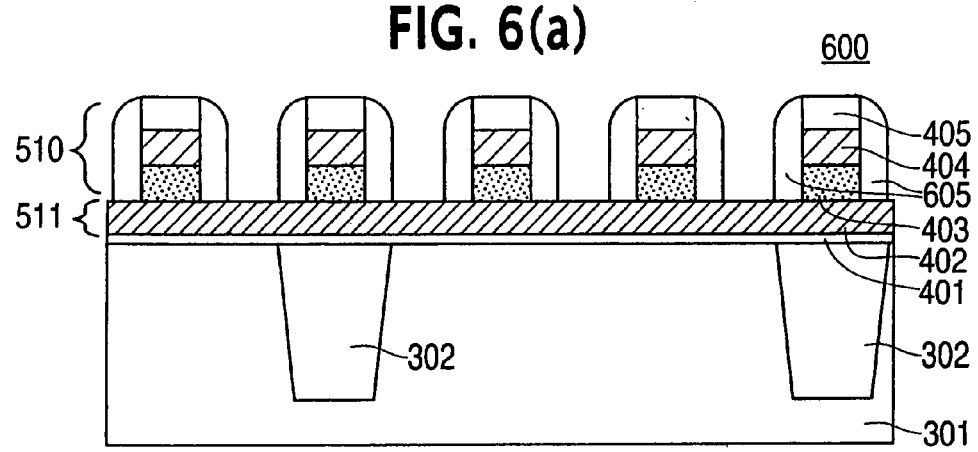
FIGS. 6(a) and 6(b) are a cross section and top view, respectively, of a second dielectric layer defining a first etched layer.
Figure 6B:
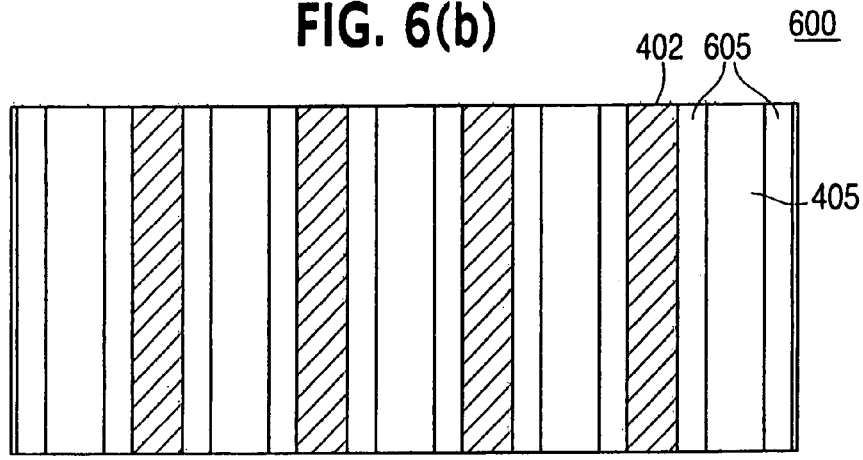

FIGS. 6(a) and 6(b) are a cross section and top view, respectively, of device 600. A second dielectric layer is deposited over device 500 after removal of photoresist 505. The second dielectric layer may be deposited according to any method known to one of ordinary skill in the art, including but not limited to, PE-CVD, LP-CVD, or atomic layer deposition ("ALD"). The second dielectric layer is then etched to form a first spacer 605, which defines first etched layer 510. The second dielectric layer, and consequently first spacer 605, may comprise SiN or another dielectric material with high SiO$_2$ etch selectivity. Etch selectivity of SiN in oxide etch is the ratio of the etch rate of SiO$_2$ to the etch rate of SiN, and a high etch rate may be a ratio of at least 5:1. Further, first spacer 605 may comprise the same or different material as first dielectric layer 405.

A first doped region is then formed in active area 301 according to first spacer 605 (step 205). First spacer 605 acts as a mask to define regions of active area 301 along the word line to be doped. Active area 301 is then doped, thus forming a first doped region.

FIGS. 7(a) and 7(b) are a cross section and top view, respectively, of device 700. First spacer 605 is used as a mask for etching one or more layers comprising unetched layer 511 to form a second etched layer 710. In one embodiment, unetched layer 511 comprises insulator layer 401 and first electrode layer 402. Using first spacer 605 as a mask to etch unetched layer 511 forms second etched layer 710 comprising first electrode layer 402. One skilled in the art will recognize that second etched layer may further comprise insulator layer 401.

In another embodiment, unetched layer comprises insulator layer 401, first electrode layer 402, and ferroelectric layer 403. Using first spacer 605 as a mask to etch unetched layer in this embodiment forms a second etched layer comprising ferroelectric layer 403 and first electrode layer 402. One skilled in the art will recognize that second etched layer may further comprise insulator layer 401.

Those regions of substrate 300 not protected by first electrode layer 402 are implanted with a first dopant, which results in a doped region 701, thus forming device 700. First dopant may be implanted by, for example, ion implantation. First dopant may be n– type, including but not limited to P or As, or may be p– type, including but not limited to B or BF$^2$, and may be lightly doped with a dopant concentration of, for example, 1×10$^{12}$~1×10$^{16}$ atoms/cm$^2$.

A second doped region is next formed in the active area 301 and STI 302 according to a second spacer (step 206). A third dielectric layer is deposited over device 700 and etched to form a second spacer that acts as a mask to define regions of active area 301 along the word line to be doped. Active area 301 is then doped, thus forming a second doped region.

FIGS. 8(a) and 8(b) are a cross section and top view, respectively, of device 800. A third dielectric layer is deposited on device 700 and etched to form a second spacer 805, which defines an inverted T-shaped gate stack 810 comprising first dielectric layer 405, second electrode layer 404, ferroelectric layer 403, and first electrode layer 402. In another embodiment, inverted T-shaped gate stack defined by second spacer 805 may further comprise insulator layer 401. The third dielectric layer and, consequently, second spacer 805 may comprise SiN or another dielectric material with high SiO$_2$ etch selectivity.

Inverted T-shaped gate stack 810 defined by second spacer 805 comprises first etched layer 510 and second etched layer 710. Some possible embodiments of first etched layer and second etched layer have been discussed above.

Those regions of substrate 300 not protected by either first electrode layer 402 or second spacer 805 are implanted with a second dopant, which results in second doped region 801. Second dopant may be implanted by, for example, ion implantation and may be n+ type or p+ type. Also, second dopant may be highly doped with a dopant concentration greater than that of the lightly doped region. However, one skilled in the art will recognize that a generally uniform doped region may be provided rather that a lightly doped and a heavily doped region.

Processing next flows to step 207 where an interlayer dielectric ("ILD") is deposited over device 800. The ILD covers the device and fills the word line between inverted T-shaped gate stacks.

A photoresist mask with contact hole patterning is then used to etch contact holes in the ILD (step 208). The ILD is etched according to the contact hole pattern, thus forming contact holes in the device.

FIGS. 9(a) and 9(b) are a cross section and top view, respectively, of device 900. An interlayer dielectric ("ILD") 905, which may be, for example, BPSG, TEOS, HPD oxide, SOG, and FSG, is deposited on device 800, which fills the word line between inverted T-shaped gate stacks 810. ILD 905 may be deposited by any appropriate method, including but not limited to, PECVD, APCVD, LPCVD, HDPCVD, and ALD. A photoresist mask 901 with contact hole patterning covers device 800 further comprising ILD 905 to allow etching of contact holes in ILD 905.

Photoresist mask 901 with contact hole patterning 902 is used to perform self-aligned contact ("SAC") etching of ILD 905, which opens one or more contact holes in ILD 905, leaving ILD 905 covering those areas protected by photoresist mask 901. The characteristics of SAC etching and the high etch selectivity between second spacer 805 and ILD 905 preserve second spacer 805. Photoresist mask 901 may be removed after etching ILD 905.

Metal is then deposited to fill the contact hole (step 209) forming one or more contact plugs, which may be a bit line plug or a source line plug, in the one or more contact holes. A bit line and a source line may be coupled to a bit line plug and a source line plug, respectively.

FIGS. 10(a) and 10(b) are a cross section and top view, respectively of a fist possible embodiment of the invention. A device 1000 is formed by depositing metal, for example, W, Al, PolySi, etc., on device 900 after removal of photoresist 901 to fill contact holes formed according to contact hole patterning 902. The metal may be deposited by any appropriate method, including but not limited to PVD or CVD. The deposited metal is then, for example, etched back or subject to chemical-mechanical polishing ("CMP") to form one or more contact plugs 1001. Etching back, generally, refers to a process of removing excess materials on a surface while leaving those materials in the contact holes. Other methods known to those of skill in the art may be used to form contact plug 1001. Contact plug 1001 generically refers to a source line plug 1002 if contact plug 1001 does not contact STI 302, or a bit line plug 1003 if contact plug 1001 contacts STI 302.

The thickness of second spacer 805 may be thick enough to provide electrical isolation between second etched layer, discussed above, and contact plug 1001, and may be, for example, about 50~600 Å. The thickness of second spacer 805 used to establish electrical isolation will depend on the materials used to form layers in the second etched layer and contact plug 1001.

Referring to FIG. 11, a cross section of the first embodiment of the invention with possible electric connections is shown. A device 1100 is fabricated by coupling source line plug 1002 and bit line plug 1003 to a source line 1102 and a bit line 1103, respectively. Source line 1102 and bit line 1103 should be at different levels, which may result by forming bit line 1103 and source line 1102 using different masks at different heights. Source line 1102 and bit line 1103 may be connected using conventional interconnect processes.

Figure 12:
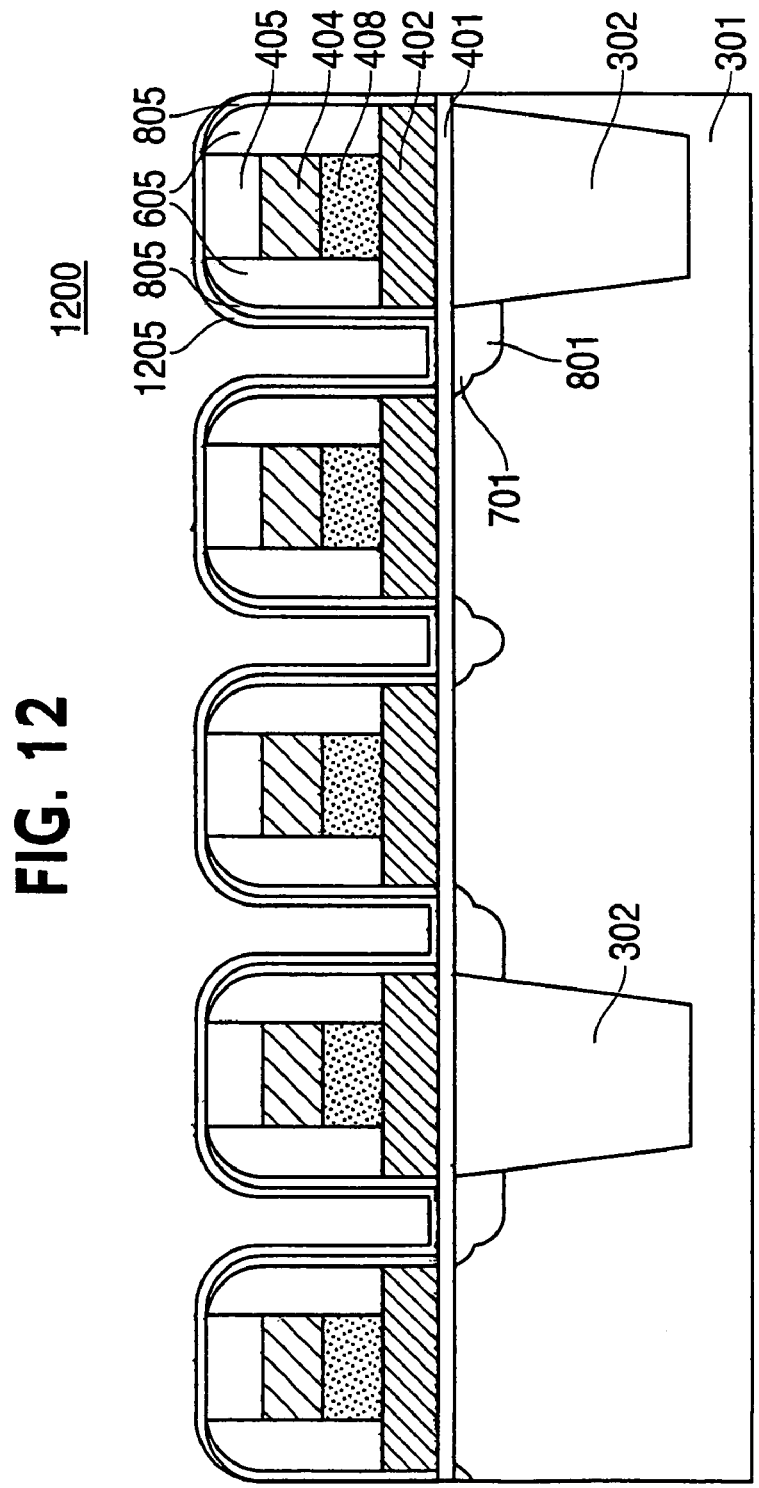
FIG. 12 is a cross section of a second embodiment of the invention.

FIG. 12 is a cross section of a second embodiment of the invention. A device 1200 may be fabricated according to a similar method to that disclosed with respect to FIGS. 2(a) and 2(b). Device 1200 further comprises a fourth dielectric layer 1205, which may be deposited by any appropriate method, including but not limited to LPCVD, ALD, and SACVD, and further may be, for example, 20~300 Å of uniform thickness. Fourth dielectric layer 1205 may be deposited after formation of second spacer 805 and before depositing ILD 905, and then etched according to contact hole patterning 902 when forming contact hole 905 to act as an etch-stop layer during contact etching, which may minimize etching of STI recess. Fourth dielectric layer 1205 may provide for additional electrical isolation between contact plug 1001 and second etched layer 511, during operation of the device (step 208). Further, fourth dielectric layer 1205 may comprise SiN or another dielectric material with high $SiO_2$ etch selectivity.

Figure 13:
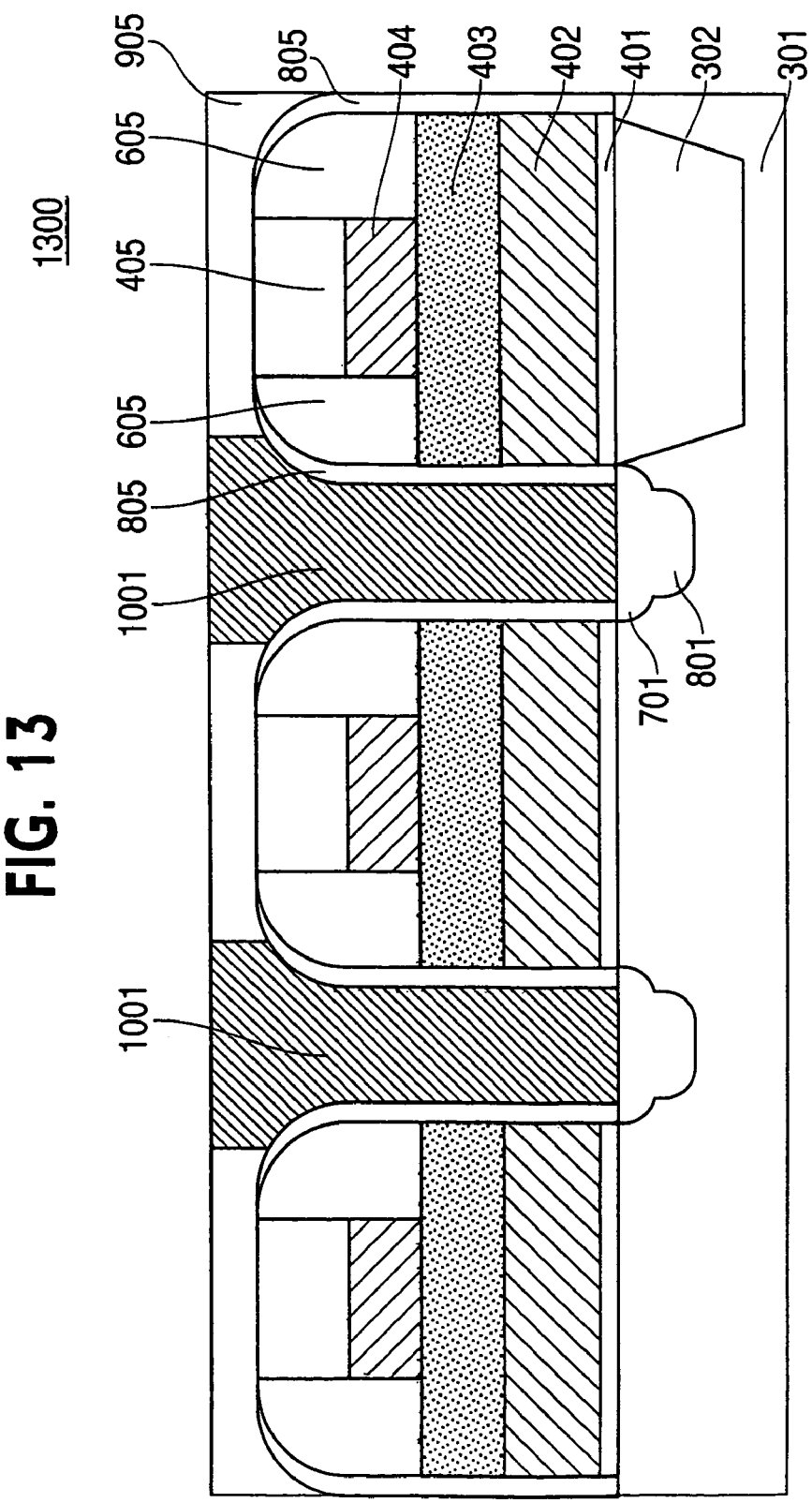
FIG. 13 is a cross section of a third embodiment of the invention.

FIG. 13 is a cross section of a third embodiment of the invention. A device 1300 may be fabricated according to a similar method to that disclosed with respect to FIGS. 2(a) and 2(b), such that first spacer 605 is used as a mask to etch unetched layer 511 further comprising insulator layer 401. Thus, second spacer 805 is formed to define insulator layer 401, first electrode layer 402, ferroelectric layer 403, second electrode layer 404, and dielectric layer 405. Second spacer 805 may also provide electrical isolation between contact plug 1001 and first electrode layer 402 and ferroelectric layer 403. One skilled in the art will further recognize that a fourth dielectric layer 1205 (see FIG. 12) could be deposited to define second spacer 805 or to define second spacer 805 and dielectric layer 405 as discussed with respect to FIG. 10.

Figure 14:
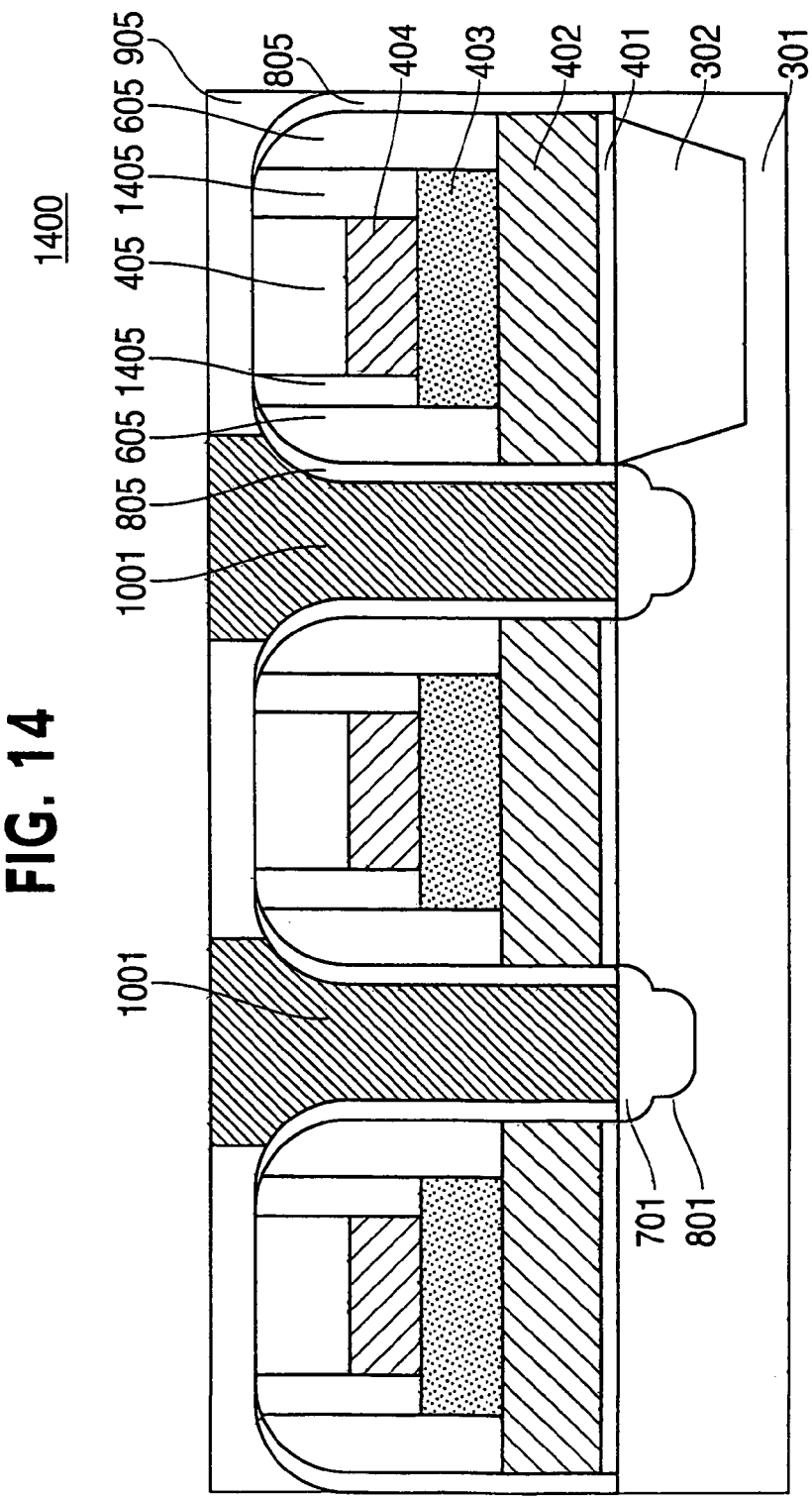
FIG. 14 is a cross section of a fourth embodiment of the invention.

FIG. 14 is a cross section of a fourth embodiment of the invention. A device 1400 may be fabricated according to a similar method to that disclosed with respect to FIGS. 2(a) and 2(b), such that a first etched layer comprises second electrode layer 404 and dielectric layer 405. A fifth dielectric layer may be deposited and etched to form a fourth spacer 1405. Fifth dielectric layer is deposited on first etched layer and then acts as a mask to etch ferroelectric layer 403, which then forms a second etched layer. Second dielectric layer is then deposited and etched to form first spacer 605, which defines ferroelectric layer 403 and first etched layer, discussed above.

Figure 15:
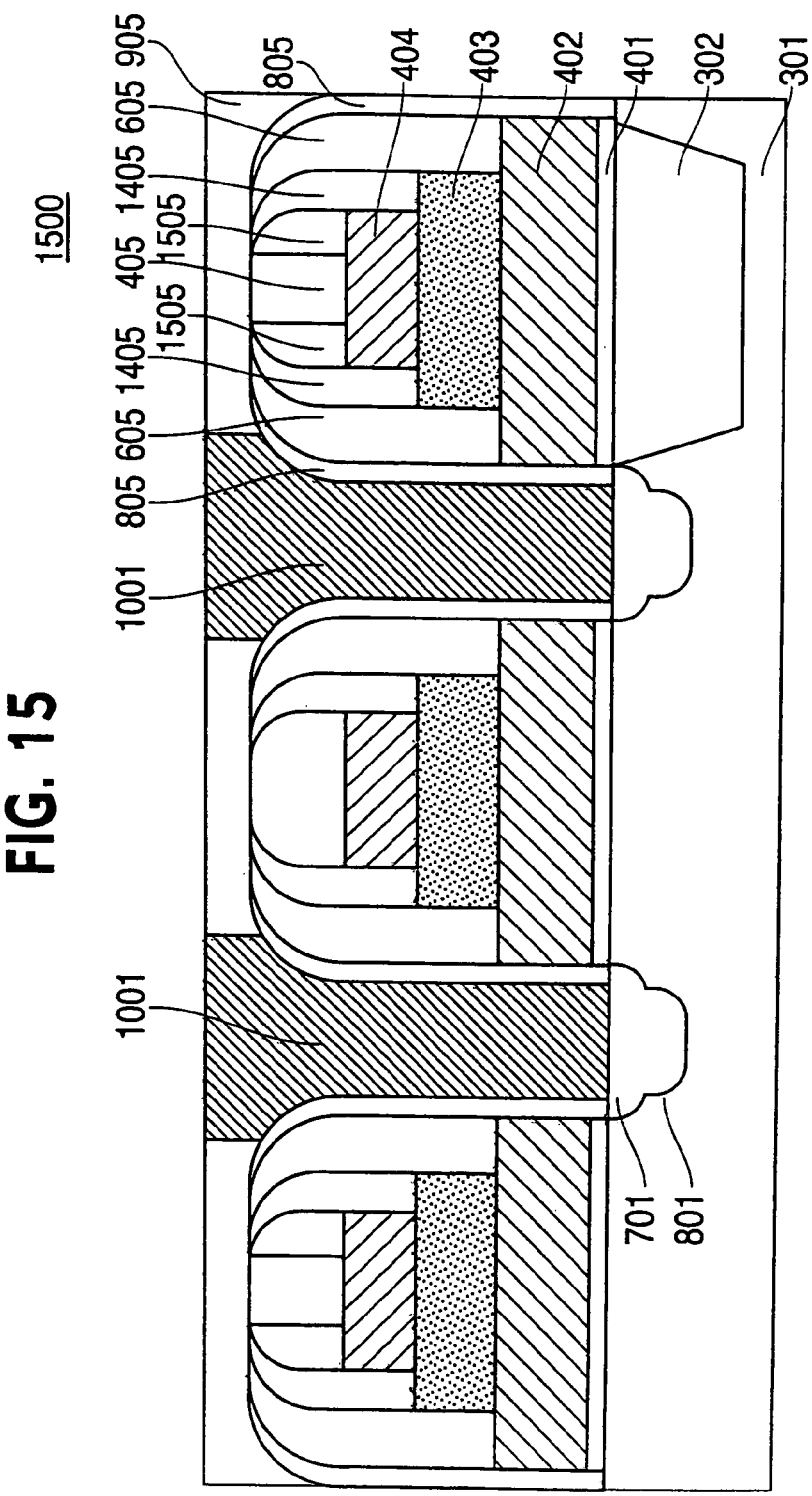
FIG. 15 is a cross section of a fifth embodiment of the invention.

FIG. 15 is a cross section of a fifth embodiment of the invention. A device 1500 may be fabricated according to a similar method to that disclosed with respect to FIGS. 2(a) and 2(b), such that a first etched layer comprises dielectric layer 405. A sixth dielectric layer may be deposited and etched to form a fifth spacer 1505, to define first etched layer comprising first dielectric layer 405 and then acts as a mask to etch second electrode layer 404, or second electrode layer 4040 and ferroelectric layer 403 in another embodiment. A fifth dielectric layer may then be deposited and etched to form fourth spacer 1405, which defines second etched layer then acts as a mask to etch ferroelectric layer 403. Second dielectric layer is then deposited and etched to form first spacer 605, which defines ferroelectric layer 403 and first and second etched layers, discussed above.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a ferroelectric device, comprising:
   forming at least one active area on a silicon substrate by an isolation area;
   depositing a plurality of layers on the at least one active area and the isolation area, wherein the plurality of layers includes an insulator layer, a first electrode layer, a ferroelectric layer, a second electrode layer, and a first dielectric layer, wherein the ferroelectric layer comprises a material selected from a group consisting of PZT, $BaMgF_4$, $LiNbO_3$, PLZT, STO, SNO, SBT ($SrBi_2Ta_2O_3$), and BTO($BaTiO_3$);
   etching at least one of the plurality of layers based on a word line mask to form a first etched layer and an unetched layer;
   forming a first spacer to define the first etched layer;
   etching at least a portion of the unetched layer based on the first spacer to form a second etched layer;
   forming a second spacer to define the second etched layer;
   forming an interlayer dielectric;
   opening a contact hole in the interlayer dielectric; and
   forming a conductor to fill the contact hole.

2. The method of claim 1, further comprising doping a first region of the at least one active area and the isolation area, wherein the first region is determined by the first spacer.

3. The method of claim 1, further comprising doping a second region of the at least one active area and the isolation area, wherein the second region is determined by the second spacer.

4. The method of claim 1, further comprising depositing at least one additional dielectric layer.

5. The method of claim 4, wherein the at least one additional dielectric layer is deposited before depositing the interlayer dielectric.

6. The method of claim 1, wherein the etching the word line mask stops at the first electrode layer.

7. The method of claim 1, wherein the etching the word line mask stops at the ferroelectric layer.

8. The method of claim 1, wherein the first spacer is used to etch the first electrode layer.

9. The method of claim 1, further comprising forming a contact plug.

10. The method of claim 9, wherein forming the contact plug is done by chemical mechanical polishing.

11. The method of claim 9, wherein forming the contact plug is done by etching.

12. The method of claim 9, wherein the contact plug comprises a bit line plug.

13. The method of claim 12, further comprising coupling a bit line to the bit line plug.

14. The method of claim 9, wherein the contact plug comprises a source line plug.

15. The method of claim 14, further comprising coupling a source line to the source line plug.

16. The method of claim 1, wherein the first region is lightly doped.

17. The method of claim 1, wherein the second region is heavily doped.

18. The method of claim 1, wherein opening a contact hole is performed by self-alignment contact method.

19. The method of claim 1, wherein the dielectric layer is SiN.

20. The method of claim 1, wherein the first spacer is $SiO_2$.

21. The method of claim 1, wherein the dielectric layer has high $SiO_2$ etch selectivity.

22. The method of claim 1, wherein the first electrode layer is selected from a group consisting of a metal, a semiconductor material, a metal oxide, and a material with high electrical conductivity, and the second electrode layer is selected from a group consisting of a metal, a semiconductor material, a metal oxide, and a material with high electrical conductivity.

23. The method of claim 1, wherein each of the first electrode layer and the second electrode layer is a multilayer combination of conductors.

24. The method of claim 1, wherein the first region is doped with n− material.

25. The method of claim 1, wherein the second region is doped with n+ material.

26. A method of forming a ferroelectric device, comprising:
   forming at least one active area on a silicon substrate by an isolation area;
   depositing a plurality of layers on the at least one active area and the isolation area, wherein the plurality of layers includes an insulator layer, a first electrode layer, a ferroelectric layer, a second electrode layer, and a first dielectric layer;
   etching at least one of the plurality of layers based on a word line mask to form a first etched layer and an unetched layer;
   forming a first spacer to define the first etched layer;
   doping a first region of the at least one active area and the isolation area, wherein the first region is determined by the first spacer;
   etching at least a portion of the unetched layer based on the first spacer to form a second etched layer;
   forming a second spacer to define the second etched layer;
   forming an interlayer dielectric;
   opening a contact hole in the interlayer dielectric; and
   forming a conductor to fill the contact hole.

* * * * *